United States Patent
Lee et al.

(10) Patent No.: US 12,106,345 B2
(45) Date of Patent: Oct. 1, 2024

(54) SURVEILLANCE PLANNING DEVICE AND METHOD FOR PROVIDING SECURITY DEVICE INSTALLATION SOLUTION USING SAME

(71) Applicant: HANWHA TECHWIN CO., LTD., Seongnam-si (KR)

(72) Inventors: Sang Yun Lee, Seongnam-si (KR); Dong Won Kim, Seongnam-si (KR); Hye Lyoung Choi, Seongnam-si (KR); Haan Joon Lee, Seongnam-si (KR)

(73) Assignee: Hanwha Vision Co., Ltd., Seongnam-si (KR)

( * ) Notice: Subject to any disclaimer, the term of this patent is extended or adjusted under 35 U.S.C. 154(b) by 349 days.

(21) Appl. No.: 17/500,948

(22) Filed: Oct. 14, 2021

(65) Prior Publication Data
US 2022/0036420 A1    Feb. 3, 2022

Related U.S. Application Data

(63) Continuation-in-part of application No. PCT/KR2019/006340, filed on May 27, 2019.

(30) Foreign Application Priority Data

May 3, 2019    (KR) .................. 10-2019-0052374

(51) Int. Cl.
*G06Q 30/0601*    (2023.01)
*G06F 30/13*    (2020.01)
*G06F 30/20*    (2020.01)

(52) U.S. Cl.
CPC ......... *G06Q 30/0621* (2013.01); *G06F 30/13* (2020.01); *G06F 30/20* (2020.01);
(Continued)

(58) Field of Classification Search
CPC ........... G06Q 30/0621; G06Q 30/0625; G06Q 30/0631; G06Q 30/0643; G06F 30/20; G06F 30/30; G06F 30/13
(Continued)

(56) References Cited

U.S. PATENT DOCUMENTS 8,193,904 B2 *    6/2012    Kawakita ................. G07C 9/38
                                                    713/184
8,482,609 B1 *    7/2013    Mishra ............... G08B 13/1968
                                                    348/143
(Continued)

FOREIGN PATENT DOCUMENTS

KR    10-2001-0078446 A    8/2001
KR    10-2009-0132339 A    12/2009
(Continued)

OTHER PUBLICATIONS

Korean Office Action issued on Feb. 21, 2024 for KR Application 10-2019-0052374.

*Primary Examiner* — Frantz B Jean
(74) *Attorney, Agent, or Firm* — McLean IP Global; Jason Y. Pahng

(57) ABSTRACT

Provided is a surveillance planning device configured to generate a checklist with respect to a region based on spatial information and object information of the region, obtain device installation condition information based on a user response to the checklist, and recommend, to a user, a list of devices to be installed in the region and an installation location of the devices based on the spatial information, the object information, and the device installation condition information.

20 Claims, 12 Drawing Sheets

(52) U.S. Cl.
CPC ..... *G06Q 30/0625* (2013.01); *G06Q 30/0631* (2013.01); *G06Q 30/0643* (2013.01)

(58) Field of Classification Search
USPC ......................................................... 348/144
See application file for complete search history.

(56) References Cited

U.S. PATENT DOCUMENTS

| | | | |
|---|---|---|---|
| 2014/0192159 A1* | 7/2014 | Chen | ............. G06T 15/20 348/46 |
| 2016/0232777 A1* | 8/2016 | Jedwab | ............. G08B 13/19652 |
| 2017/0148340 A1* | 5/2017 | Popa-Simil | ............. G09B 9/48 |
| 2017/0163918 A1* | 6/2017 | Chen | ............. H04N 23/673 |
| 2017/0193307 A1* | 7/2017 | Stelzer | ............. G06T 7/246 |
| 2017/0323376 A1* | 11/2017 | Glaser | ............. G06V 20/52 |

FOREIGN PATENT DOCUMENTS

| | | | | |
|---|---|---|---|---|
| KR | 10-2016-0059243 A | 5/2016 | | |
| KR | 10-1644857 B1 | 8/2016 | | |
| KR | 10-2017-0014133 A | 2/2017 | | |
| KR | 10-2017-0019108 A | 2/2017 | | |
| KR | 20170014133 A | * | 2/2017 | ............. H04N 7/18 |
| KR | 10-2017-0104064 A | 9/2017 | | |
| KR | 10-2018-0007845 A | 1/2018 | | |

\* cited by examiner

| DEVICE | MODEL | TYPE | FUNCTION | PRICE | OTHERS |
|--------|-------|------|----------|-------|--------|
| 1 | XX | △△ | ○○ | □□ | ⋯ |
| 2 | XX | △△ | ○○ | □□ | ⋯ |
| 3 | XX | △△ | ○○ | □□ | ⋯ | ized
SURVEILLANCE PLANNING DEVICE AND METHOD FOR PROVIDING SECURITY DEVICE INSTALLATION SOLUTION USING SAME This application is a continuation-in-part of international patent application number PCT/KR2019/006340, filed on May 27, 2019, which is hereby incorporated by reference in their entirety. In addition, this application claims priority from Korean application number 10-2019-0052374, filed on May 3, 2019, which is hereby incorporated by reference in their entirety.

TECHNICAL FIELD

Embodiments of the present disclosure relate to a surveillance planning device for establishing a surveillance system and a surveillance planning method using the same.

BACKGROUND ART

An installation engineer or a purchaser who is installing a camera in a building needs to select an installation location and a type of camera by looking at the site by himself or herself and based on experience. Moreover, a person who bought a camera but is not familiar with cameras has difficulty in selecting an optimal location to install a camera. The purchaser has to repeat installation and disassembly several times to have images captured at desired angles and positions. Also, it is even more difficult to select an appropriate type of camera for a location where the camera is to be installed.

DESCRIPTION OF EMBODIMENTS

Technical Problem

Embodiments of the present disclosure provide a surveillance planning device and a surveillance planning method, which allow a user to check an installation location of a security device before the purchase of the security device and to efficiently purchase and install the security device.

Solution to Problem

A surveillance planning device according to an embodiment of the present disclosure includes: a first collecting unit configured to obtain spatial information and object information of a region, from a user terminal; a second collecting unit configured to generate a checklist with respect to the region based on at least one of the spatial information and the object information and obtain device installation condition information based on a user response to the checklist, received from the user terminal; a recommendation unit configured to provide, to the user terminal, a list of devices to be installed in the region based on the spatial information, the object information, and the device installation condition information and provide an installation location of a device selected from the list, to the user terminal; and a simulation unit configured to provide an operation simulation result of the device at the installation location to the user terminal.

The first collecting unit may receive an image of each of a plurality of regions of a site where the device is to be installed, from the user terminal, and obtain spatial information and object information from the image.

The second collecting unit may generate a checklist of each of the plurality of regions.

The checklist may include a budget item.

The second collecting unit may provide a list of objects detected from the image as one of plurality of items of the checklist.

The recommendation unit may receive a signal for changing the installation location from the user terminal and re-generate a list of cameras suitable for the changed installation location.

The recommendation unit may recommend an installation location of a device for monitoring a plurality of sub-regions designated in an image of the region and an installation location of a device for monitoring a blind region other than the sub-regions.

The simulation unit may provide a surveillance range of the device to the user terminal, and change a setting of the device when a signal for adjusting the surveillance range of the device is received from the user terminal.

The recommendation unit may recommend a device to monitor the adjusted surveillance range and an installation location of the device again.

The recommendation unit may provide specifications and purchase information of the device to the user terminal.

A method, performed by a surveillance planning device according to an embodiment of the present disclosure, of providing a security device installation solution includes: obtaining spatial information and object information of a region, from a user terminal; generating a checklist with respect to the region based on at least one of the spatial information and the object information; obtaining device installation condition information based on a user response to the checklist, received from the user terminal; providing, to the user terminal, a list of devices to be installed in the region based on the spatial information, the object information, and the device installation condition information; providing an installation location of a device selected from the list, to the user terminal; and providing an operation simulation result of the device at the installation location to the user terminal.

The obtaining of the spatial information and object information may include receiving an image of each of a plurality of regions of a site where the device is to be installed, from the user terminal, and obtaining spatial information and object information from the image.

The generating of the checklist may include generating a checklist of each of the plurality of regions.

The checklist may include a budget item.

A list of objects detected from the image may be provided as one of plurality of items of the checklist.

The method may further include receiving a signal for changing the installation location from the user terminal and re-generating a list of cameras suitable for the changed installation location.

The providing of the installation location may include recommending an installation location of a device for monitoring a plurality of sub-regions designated in an image of the region and an installation location of a device for monitoring a blind region other than the sub-regions.

The method may further include providing a surveillance range of the device to the user terminal, and changing a setting of the device when a signal for adjusting the surveillance range of the device is received from the user terminal.

The method may further include recommending a device to monitor the adjusted surveillance range and an installation location of the device again.

The method may further include specifications and purchase information of the device to the user terminal.

Advantageous Effects of Disclosure

According to embodiments of the present disclosure, a user may check an installation location of a security device before the purchase of the security device and efficiently purchase and install the security device.

BEST MODE

Figure 1:
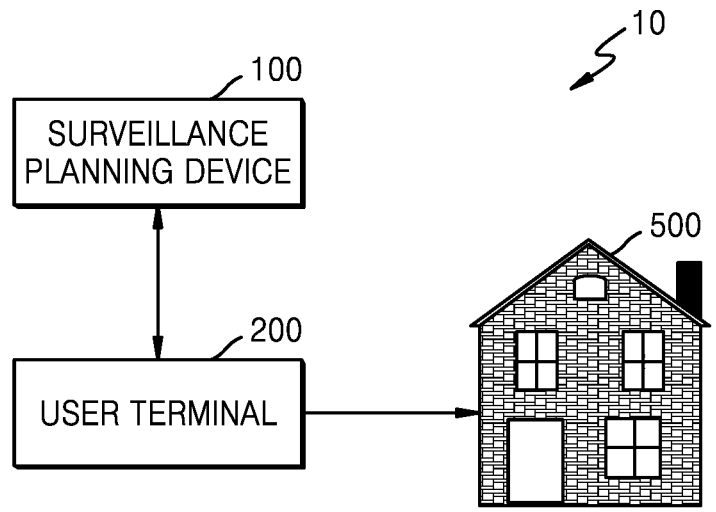
FIG. 1 is a schematic diagram of a surveillance planning system according to an embodiment of the present disclosure.

A surveillance planning device according to an embodiment of the present disclosure includes: a first collecting unit configured to obtain spatial information and object information of a region, from a user terminal; a second collecting unit configured to generate a checklist with respect to the region based on at least one of the spatial information and the object information and obtain device installation condition information based on a user response to the checklist, received from the user terminal; a recommendation unit configured to provide a list of devices to be installed in the region based on the spatial information, the object information, and the device installation condition information to the user terminal and provide an installation location of a device selected from the list, to the user terminal; and a simulation unit configured to provide an operation simulation result of the device at the installation location to the user terminal.

MODE OF DISCLOSURE

The following description exemplifies only the principles of the present disclosure. Even if they are not described or illustrated clearly in the present specification, those of ordinary skill in the art can embody the principles of the present disclosure and invent various apparatuses within the concept and scope of the present disclosure. The use of the conditional terms and embodiments presented in the present specification are intended only to make the concept of the present disclosure understood, and they are not limited to the embodiments and conditions mentioned in the specification. In addition, all the detailed description on the principles, viewpoints and embodiments and particular embodiments of the present disclosure should be understood to include structural and functional equivalents to them. The equivalents include not only currently known equivalents but also those to be developed in future, that is, all devices invented to perform the same function, regardless of their structures.

Therefore, functions of various devices illustrated in the drawings including a functional block expressed as a processor or a similar concept can be provided not only by using hardware dedicated to the functions, but also by using hardware capable of running proper software for the functions. When a function is provided by a processor, the function may be provided by a single dedicated processor, single shared processor, or a plurality of individual processors, part of which can be shared. The apparent use of a term, 'processor', 'control' or a similar concept, should not be understood to exclusively refer to a piece of hardware capable of running software, but should be understood to include a digital signal processor (DSP), hardware, and ROM, RAM and non-volatile memory for storing software, implicatively. Other known and commonly used hardware may also be included therein.

The foregoing objects, features, and advantages will be more apparent from the following detailed description made with reference to the accompanying drawings. In the description of the present disclosure, the detailed description of known techniques which might unnecessarily obscure the subject matter of the present disclosure will be omitted or made in brief.

The terms used herein are merely used to describe particular embodiments, and are not intended to limit the present disclosure. An expression used in the singular form encompasses the expression in the plural form, unless it has a clearly different meaning in the context. Herein, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

While such terms as "first", "second", etc., may be used to describe various elements, such elements should not be limited to the above terms. The above terms are used only to distinguish one element from another.

The present disclosure according to exemplary embodiments will now be described more fully with reference to the accompanying drawings.

FIG. 1 is a schematic diagram of a surveillance planning system according to an embodiment of the present disclosure.

Referring to FIG. 1, a surveillance planning system 10 according to an embodiment may include a surveillance planning device 100 and a user terminal 200. The surveillance planning device 100 and the user terminal 200 may be connected to each other via a wired and/or wireless network.

The network may include wired networks and wireless Internet such as 3G, 4G (LTE), Wi-Fi, Wibro, Wimax, etc., and wireless networks including short-range communication such as Bluetooth, Radio Frequency Identification (RFID), infrared communication (IrDA, infrared Data Association), Ultra Wideband (UWB), ZigBee, Near Field Communication (NFC), or the like. In wireless mobile communication, the network may further include a component such as a base station (BTS), a mobile switching center (MSC), a home location register (HLR), an access gateway that enables transmission and reception of wireless packet data, a packet data serving node (PDSN), etc.

The surveillance planning device 100 may provide a device installation solution for efficiently installing security devices inside and outside a site 500 requiring security, such as offices, houses, hospitals, banks, and public buildings. The device installation solution may include a series of processes in which the surveillance planning device 100 recommends at least one security device suitable for device installation conditions and an installation location of the security device to a user by using information of the security device stored in a database (DB). The security device may be a device used for security, such as a detection sensor, for example, a human body sensor and a vibration sensor, lighting, or a camera.

The surveillance planning device 100 may receive, from the user terminal 200, an image of at least one region of the site 500 where a security device is to be installed, and obtain three-dimensional spatial information and/or object information through image analysis. The surveillance planning device 100 may provide an optimal device installation solution for surveillance of a region and/or an object to the user terminal 200 based on spatial information and/or object information. The surveillance planning device 100 may generate a checklist for each region and/or each object based on spatial information and/or object information, and obtain device installation condition information by analyzing the checklist. The surveillance planning device 100 may provide an optimal device installation solution for surveillance of a region and/or an object to the user terminal 200 based on spatial information and/or object information and device installation condition information.

The surveillance planning device 100 may be connected to an advertisement providing server and a security device vendor through a network. The surveillance planning device 100 may receive advertisement content of a security device from the advertisement providing server and provide the same to the user terminal 200. The surveillance planning device 100 may provide information on a vendor of the security device to the user terminal 200.

The surveillance planning device 100 may include a plurality of computer systems or computer software which are implemented as a network server, and provide a user interface (UI) (hereinafter referred to as an interface) required to implement a service provided by the surveillance planning system 10 according to the present disclosure, to the user terminal 200. Here, the network server refers to a computer system or computer software (network server program) that is connected to a subordinate device capable of communicating with another network server through a computer network such as a private intranet or the Internet and receives a request for performing a task, performs the task, and provides a result of performing the task. However, in addition to the above-described network server program, the network server should be understood as a broad concept including a series of application programs operating on the network server and various databases built therein in some cases. The network server may be implemented using a network server program that is variously provided according to an operating system such as DOS, Windows, Linux, UNIX, or MacOS.

The user terminal 200 may access the surveillance planning device 100 when the user executes a device installation application installed in the user terminal 200. The user may be a subject that monitors a space of the site 500 where a security device is to be installed. The user may be a company that installs a security device in the space of the site 500.

The user terminal 200 may provide an image obtained by scanning at least one region of the site 500 where the security device is to be installed, to the surveillance planning device 100. The user terminal 200 may scan the site 500 through an interface provided by the surveillance planning device 100. The user terminal 200 may include a scanning device that captures an image of the site 500 and obtains three-dimensional information of a region, including various objects in the site 500 (e.g., static objects such as walls and obstacles, and dynamic objects such as people and animals). For example, a user who wants to purchase a CCTV installer or a CCTV may scan the site 500 where a camera is to be installed, by using a camera provided in the user terminal 200 at a mobile application provided to the user terminal 200. The user terminal 200 may include a camera or a dual camera equipped with an IR sensor, and may obtain an image by capturing an image of at least one region within the site 500. The user may designate, in the image, a sub-region or object to be monitored, through the interface of an application of the user terminal 200.

The user terminal 200 may fill in a checklist provided by the surveillance planning device 100 and reply to the surveillance planning device 100. The user terminal 200 may receive a device installation solution suitable for surveillance of a sub-region or an object provided by the surveillance planning device 100 according to device installation conditions obtained through analysis of the checklist response. The user may input information such as options, functions, and prices of the security device to the checklist through the interface of the user terminal 200 based on the sub-region or object to be monitored.

The user terminal 200 is a wired/wireless computing device capable of performing Internet communication with the surveillance planning device 100. The user terminal 200 may include a desktop PC, a tablet PC, a slate PC, a notebook computer, a portable terminal such as a smartphone, and the like.

Figure 2:
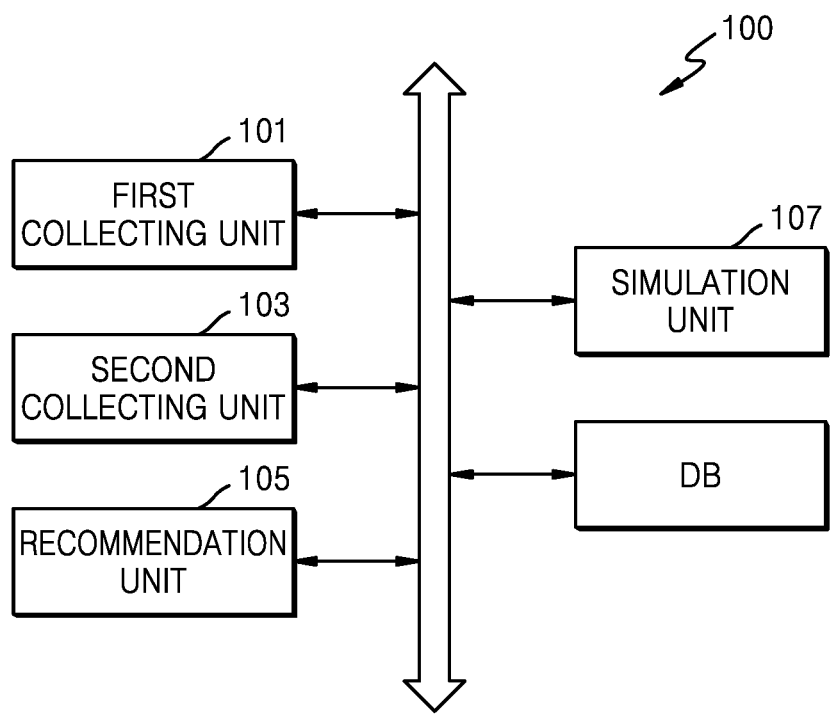
FIG. 2 is a schematic block diagram of a surveillance planning device according to an embodiment of the present disclosure.
Figure 3:
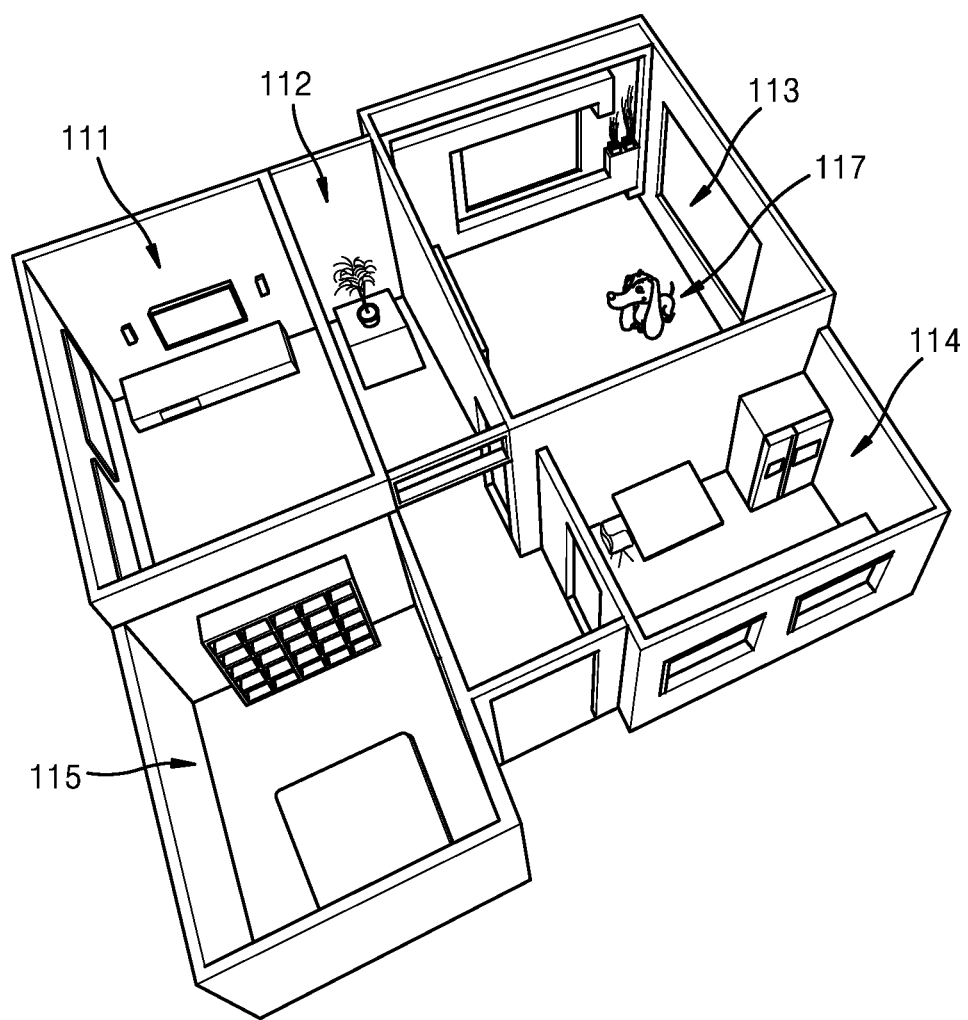
FIG. 3 illustrates an example of a site where a security device is to be installed according to an embodiment of the present disclosure.
Figure 4:
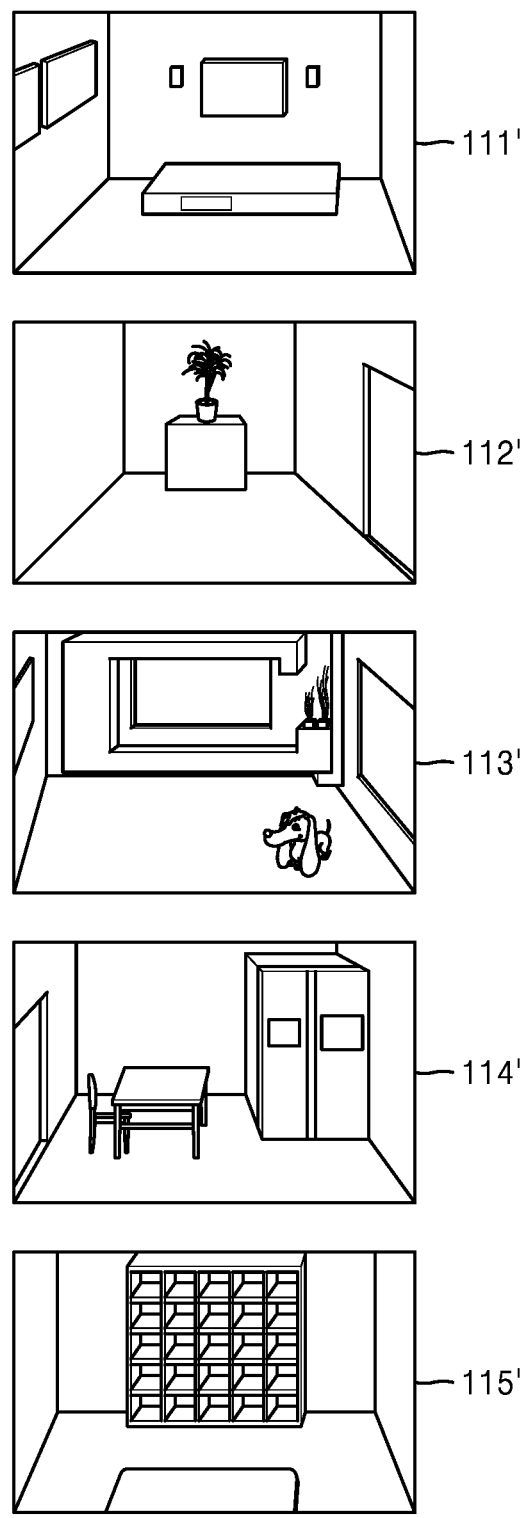
FIG. 4 illustrates an example of images obtained from regions of the site illustrated in FIG. 3.
Figures 5, 6:
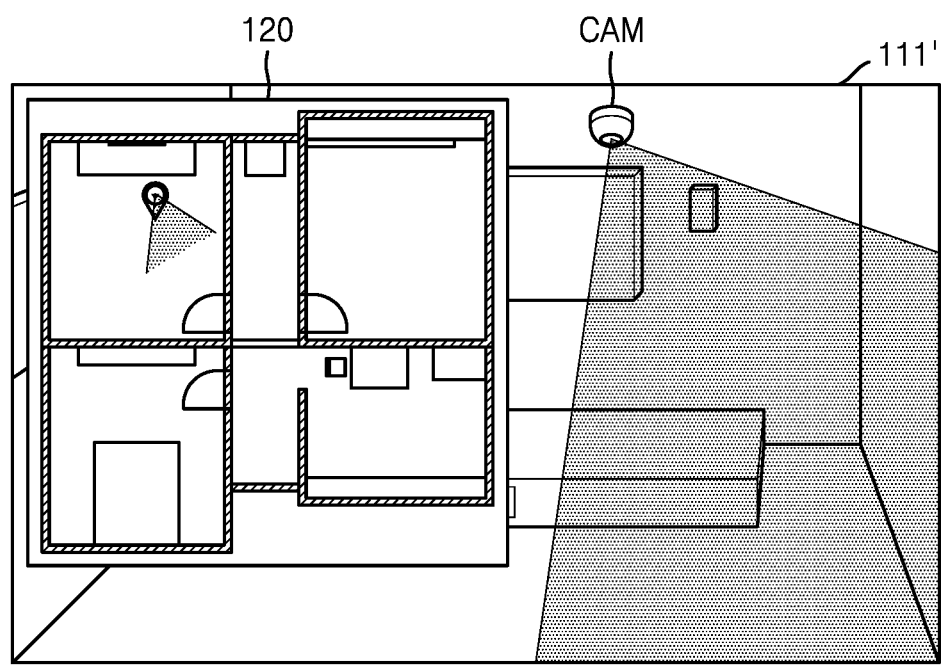
FIG. 5 illustrates an example of information of a security device stored in a database (DB) according to an embodiment of the present disclosure.
FIG. 6 illustrates an example of a simulation result of installation of a security device, provided by a surveillance planning device to a user terminal according to an embodiment of the present disclosure.

FIG. 2 is a schematic block diagram of a surveillance planning device according to an embodiment of the present disclosure. FIG. 3 illustrates an example of a site where a security device is to be installed according to an embodiment of the present disclosure. FIG. 4 illustrates an example of images obtained from regions of the site illustrated in FIG. 3. FIG. 5 illustrates an example of information of a security device stored in a database (DB) according to an embodiment of the present disclosure. FIG. 6 illustrates an example of a simulation result of installation of a security device, provided from a surveillance planning device to a user terminal according to an embodiment of the present disclosure.

Referring to FIG. 2, the surveillance planning device 100 according to an embodiment may include a first collecting unit 101, a second collecting unit 103, a recommendation unit 105, a simulation unit 107, and a database (DB). Hereinafter, for convenience of description, a case in which the security device is a camera will be described as an example.

The first collecting unit 101 may obtain spatial information and/or object information of at least one region within a site. The first collecting unit 101 may receive from the user terminal 200 an image of at least one region of a site to which the surveillance planning system 10 is applied, and obtain spatial information and/or object information of the at least one region from the image. The image may be a panoramic image. The spatial information refers to spatial features extracted from a region, and may include three-dimensional information of a space, such as the area of the region and spatial structures such as walls, floors, ceilings, corners, and columns constituting the region. The object information may be information about a static object fixedly arranged in the region and a dynamic object moving in the region.

There may be a plurality of regions in which the camera is to be installed. For example, as illustrated in FIG. 3, regions in which a camera is to be installed may include first through fifth regions 111, 112, 113, 114, and 115. As illustrated in FIG. 4, the user may obtain first through fifth images 111', 112', 113', 114', and 115' obtained by scanning the first through fifth regions 111, 112, 113, 114, and 115 using the user terminal 200, respectively. Each of the first through fifth images 111', 112', 113', 114', and 115' may be a panoramic image of each of the first through fifth regions 111, 112, 113, 114, and 115.

The first collecting unit 101 may analyze the first through fifth images 111', 112', 113', 114', and 115' received from the user terminal 200, respectively, to obtain spatial information and/or object information of the first through fifth regions 111, 112, 113, 114, and 115, respectively. For example, the first collecting unit 101 may obtain three-dimensional spatial information of the first through fifth regions 111, 112, 113, 114, and 115 by analyzing the first through fifth images 111', 112', 113', 114', and 115', and classify the first region 111, the fourth region 114, and the fifth region 115 into rooms, the second region 112 into a passage, and the third region 113 into a living room. The first collecting unit 101 may detect a pet 117 in the third region 113 and classify the same as a dynamic object.

The first collecting unit 101 may store spatial information and/or object information in the database (DB). The first collecting unit 101 may index regions and objects, respectively, and store the same in the database (DB). For example, the first collecting unit 101 may classify the first region 111, the fourth region 114, and the fifth region 115 as room 1, room 2, and room 3, respectively, and store information on this classification in the database (DB).

The first collecting unit 101 may receive a designation signal with respect to at least one sub-region for an image of each region. A sub-region may include the entire region or a portion of the region. The spatial information may include spatial information of an entire region and/or spatial information of a sub-region. The sub-region may be a region including an object. The designation signal with respect to the sub-region may be a signal for designating a certain region by a touch of a user on an image displayed on a screen of the user terminal 200.

The second collecting unit 103 may generate a checklist based on spatial information and/or object information. The checklist may include items for acquiring device installation condition information such as an operating environment of the security device in advance. For example, the checklist may include items for inputting information such as a surveillance range (indoor/outdoor), a surveillance time (day/night), camera specifications (function/angle of view (distance and scene width)/maximum resolution, etc.), audio support, image storage period, a surveillance object (non-registrant/registrant/pet/artwork, etc.), and budget. The checklist may further include items for inputting information such as a surveillance purpose (motion detection, face detection, voice detection, sound detection, tampering detection, etc.) and an installation location (wall, ceiling, floor, etc.). The second collecting unit 103 may list static objects and dynamic objects detected in the region and provide selectable items to the checklist.

The second collecting unit 103 may generate a checklist for each region. The second collecting unit 103 may generate a checklist for each region by selecting necessary items according to regions and/or objects from among a plurality of items to be applied to the checklist stored in the database (DB). In an embodiment, the second collecting unit 103 may include an object-related item in the checklist for each region. In another embodiment, the second collecting unit 103 may generate a checklist for each object separately from the checklist for each region. According to an embodiment of the present disclosure, instead of a fixed-type checklist, a checklist for each region/or a checklist for each object may be generated based on real-time image information to recommend an optimal security device that is suitable for the needs of a user.

The second collecting unit 103 may provide the checklist to the user terminal 200. The second collecting unit 103 may receive a user response to each item of the checklist from the user terminal 200, and may obtain device installation condition information by analyzing the user response. The device installation condition information may include surveillance conditions and budget conditions.

For example, the second collecting unit 103 may generate a checklist for each of the first through fifth regions 111, 112, 113, 114, and 115 based on spatial information and/or object information of each of the first through fifth regions 111, 112, 113, 114, and 115 illustrated in FIG. 3. The second collecting unit 103 may provide a checklist for each region to the user terminal 200. The checklist for each region may include items related to surveillance of objects detected from the region. The second collecting unit 103 may receive a user response to each checklist of the first through fifth regions 111, 112, 113, 114, and 115 from the user terminal 200, and analyze the user response to obtain device installation condition information for monitoring a sub-region and/or an object designated in the first through fifth regions 111, 112, 113, 114, and 115. In another embodiment, the second collecting unit 103 may generate a single checklist with respect to a plurality of regions and provide the checklist to the user terminal 200.

The recommendation unit 105 may provide a list of cameras to be installed in each region to the user terminal 200 based on spatial information and/or object information and device installation condition information. As illustrated in FIG. 5, the recommendation unit 105 may generate a list of candidate cameras by selecting at least one camera suitable for surveillance of a sub-region and/or object by considering spatial information, object information, and device installation conditions based on information of cameras, stored in the database (DB). The recommendation unit 105 may recommend an optimal camera based on installation condition information such as spatial information in which classification into ceilings, columns, walls, floors, etc. is made in an image, object information detected from the image, a camera operating environment (office, store, factory, house, etc.), a budget, or the like. For example, the recommendation unit 105 may recommend a PTZ camera for tracking a pet, a high-resolution fixed-type camera for monitoring a wall-mounted artwork, and a thermal camera for night surveillance. The recommendation unit 105 may generate a list of cameras suitable for surveillance of a sub-region and/or an object within an available budget of the user. The recommendation unit 105 may recommend a camera within an available budget by combining inexpensive cameras with expensive cameras according to spatial characteristics of a region. The recommendation unit 105 may collectively recommend cameras of the same price to a plurality of regions according to an available budget.

The recommendation unit 105 may receive a camera selection signal from a camera list from the user terminal 200, and provide an installation location of a selected camera to the user terminal 200. When a spatial range of a region is large or there is an obstacle such as a wall or a pillar in a space of the region, a plurality of cameras may be required to monitor the entire space. The recommendation unit 105 may recommend a plurality of candidate camera installation locations. The recommendation unit 105 may overlap and display, at an installation location, a virtual camera on the image displayed on the user terminal 200. The recommendation unit 105 may receive a signal for changing the installation location of the camera from the user terminal 200, and may overlap and display, at the changed installation location, the virtual camera on the image displayed on the user terminal 200.

The recommendation unit 105 may also provide, to the user terminal 200, information on which region of the plurality of regions the installation location is. For example, as illustrated in FIG. 6, the recommendation unit 105 may overlap and display a virtual camera CAM on the ceiling of the first image 111'. In addition, the recommendation unit 105 may overlap and display, on the first image 111', a plan view 120 showing that the virtual camera CAM is installed on the ceiling of the first region 111 to face the door among the first through fifth regions 111, 112, 113, 114, and 115.

The simulation unit 107 may provide a surveillance range of the camera to the user terminal 200. The simulation unit 107 may simulate an operation of the camera at the installation location and provide a simulation result to the user terminal 200. The surveillance range and the simulation result may overlap and be displayed on the image displayed on the user terminal 200. The user may adjust the surveillance range of the camera while looking at the simulation result.

The recommendation unit 105 may receive a signal for adjusting the surveillance range of the camera from the user terminal 200, change camera settings (camera posture, resolution, etc.) in response to the adjusted surveillance range to simulate an image capturing operation again, and provide a simulation result to the user terminal 200. The recommendation unit 105 may determine whether it is necessary to change the camera and the installation location thereof by adjusting the surveillance range of the camera. When it is determined that the camera and the installation location thereof need to be changed, the recommendation unit 105 may recalculate the camera and/or the installation location thereof and provide a changed list of candidate cameras and/or candidate installation locations to the user terminal 200.

The recommendation unit 105 may provide, to the user terminal 200, information on a vendor from which the user can purchase a finally selected camera, thereby providing detailed specifications and purchase information of the camera.

The database (DB) is a data structure implemented in a storage space of a computer system, and data may be retrieved, deleted, edited, added, and the like therein. The database (DB) may have appropriate fields or components for performing functions such as storing, retrieving, deleting, editing, and adding data.

The database (DB) may store information on security devices of different specifications, images of each region of a site where a security device is to be installed, and three-dimensional spatial information and object information of each region. For example, the database (DB) may include camera information such as types of camera, whether a camera is rotatable, and camera specifications. The camera specifications may include the pixel number, a maximum resolution, an angle of view, and an image capturing distance. The camera information may further include information on a service or installation environment suitable for using the camera. FIG. 5 illustrates an example in which camera specifications such as a model name, a type (dome type, straight type, etc.), a function (PTZ, wide angle, thermal image/visible image, etc.), and a price of each of three cameras are stored in the database (DB).

Figure 7:
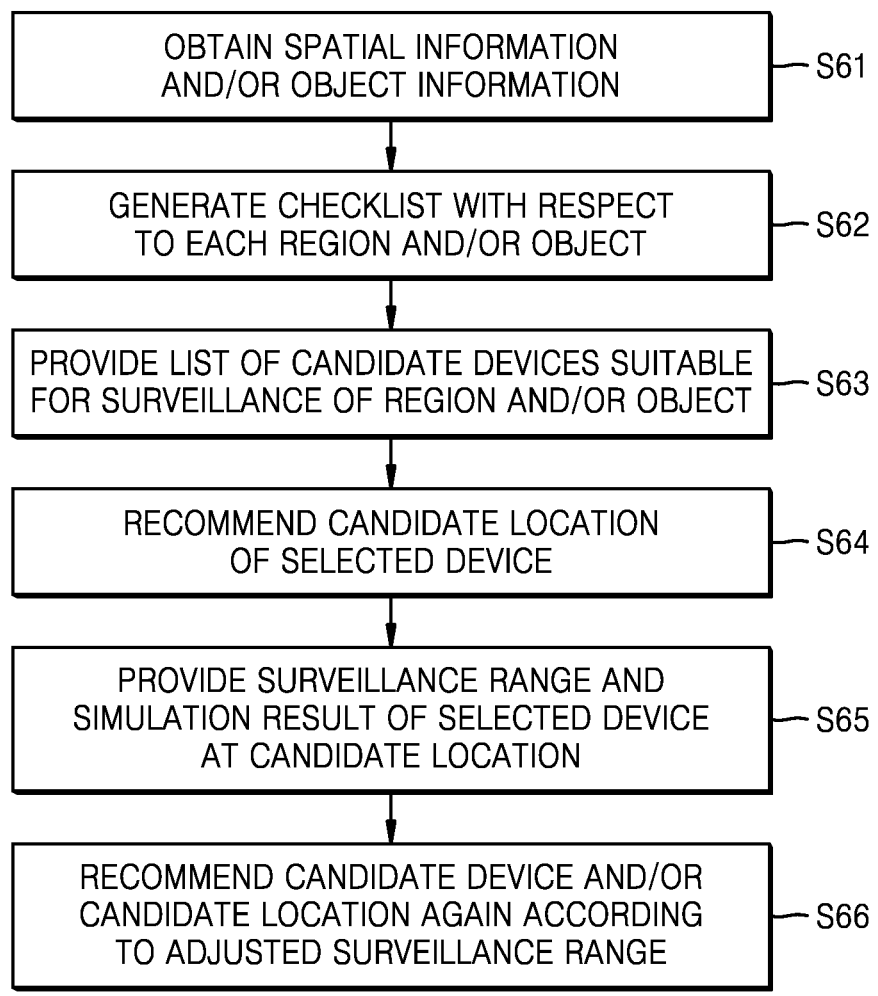
FIG. 7 is a schematic flowchart of a device installation method by using a surveillance planning device according to an embodiment of the present disclosure.

FIG. 7 is a schematic flowchart of a method of providing a security device installation solution according to an embodiment of the present disclosure. FIG. 7 illustrates a method of providing a camera installation solution. The camera installation solution may be provided by the surveillance planning device 100 of FIG. 1. Hereinafter, detailed description of those details provided above with reference to FIGS. 1 through 6 will be omitted.

Referring to FIG. 7, the surveillance planning device 100 may obtain spatial information and/or object information on a region of a site where a camera is to be installed (S61). The surveillance planning device 100 may receive an image obtained by scanning a region of the site from the user terminal 200, and may obtain spatial information of the region and/or object information within the region by analyzing the image. An image of the region obtained by scanning may be displayed on the user terminal 200. The surveillance planning device 100 may receive images of a plurality of regions from the user terminal 200 and may obtain spatial information of each of the plurality of regions and/or object information within the regions.

The surveillance planning device 100 may receive a designation signal with respect to at least one sub-region requiring surveillance within the region from the user terminal 200. The spatial information may include spatial information of an entire region and/or spatial information of a sub-region. The sub-region may be a region designated by the user in the image displayed on the user terminal 200. The sub-region may be designated while including static and/or dynamic objects within an image.

The surveillance planning device 100 may generate a checklist based on the spatial information and/or object information (S62). The surveillance planning device 100 may generate a checklist by setting different items with respect to each region. The surveillance planning device 100 may provide a list of objects in a region detected in an image as one of checklist items. The user may select an object to be monitored from the list of objects. In another embodiment, the surveillance planning device 100 may generate a checklist for each object. The surveillance planning device 100 may provide a checklist with respect to each region and/or a checklist with respect to each object to the user terminal 200.

The surveillance planning device 100 may receive a user response to the items of the checklist from the user terminal 200, and provide a list of cameras suitable for surveillance of a region and/or object based on a result of analyzing the user response (S63). The surveillance planning device 100 may obtain camera installation condition information through analysis of the user's response to the checklist. The surveillance planning device 100 may generate a list of cameras suitable for surveillance of a sub-region and/or an object based on spatial information and/or object information and installation condition information. As a plurality of sub-regions and a plurality of objects to be monitored are designated, there may be a blind region excluded from surveillance. The surveillance planning device 100 may include a camera suitable for surveillance of the blind region, in the list of cameras.

The surveillance planning device 100 may recommend an installation location of a camera selected from the list of cameras to the user terminal 200 (S64). The surveillance planning device 100 may receive a camera selection signal from the list of cameras, calculate the installation location of the selected camera, and provide the installation location to the user terminal 200. The surveillance planning device 100 may overlap and display a virtual camera at the installation location of the image displayed on the user terminal 200. The surveillance planning device 100 may overlap and display the virtual camera at a modified installation location of the image according to a request for changing the installation location.

The surveillance planning device 100 may provide a surveillance range and an operation simulation result of the camera at the installation location to the user terminal 200 (S65). The user may adjust the surveillance range while checking the simulation result.

The surveillance planning device 100 may receive a signal for adjusting the surveillance range of the camera from the user terminal 200 and recommend again a camera and/or an installation location at which an image of the adjusted surveillance range may captured (S66). When it is determined that the camera is able to capture an image of the adjusted surveillance range at the recommended installation location, the surveillance planning device 100 may change settings of the camera to enable the camera to capture an image of the surveillance range. When it is determined that the camera is not able to capture an image of the adjusted surveillance range at the recommended installation location, the surveillance planning device 100 may re-calculate a camera and/or an installation location and provide the changed camera list and/or changed installation location to the user terminal 200 again.

The surveillance planning device 100 may provide, to the user terminal 200, information on a vendor from which the user may purchase a finally selected camera, thereby providing detailed specifications and purchase information of the camera.

FIGS. 8 through 16 are diagrams illustrating an example of a camera installation plan according to an embodiment of the present disclosure.

Figure 8:
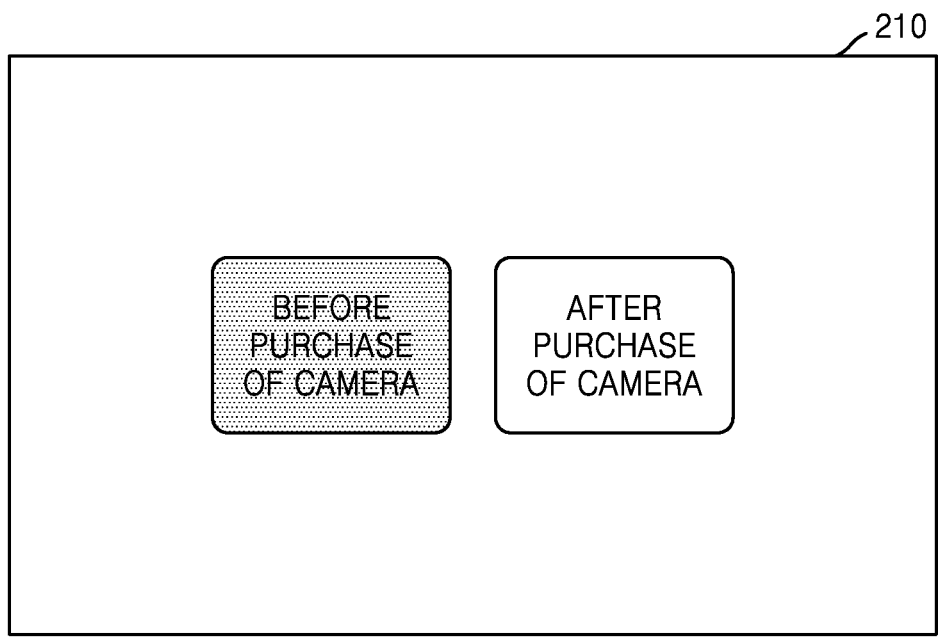
FIGS. 8 through 16 are diagrams illustrating an example of a camera installation plan according to an embodiment of the present disclosure.

FIG. 8 is a diagram illustrating an example of a menu provided to a user terminal by the surveillance planning device according to an embodiment of the present disclosure.

The user terminal 200 may access the surveillance planning device 100 by executing a security device installation application. Thereafter, data transmission or reception between the surveillance planning device 100 and the user terminal 200 may be provided through an interface of an application displayed on a screen 210 of the user terminal 200.

Referring to FIG. 8, when the security device installation application is executed, an initial selection menu received from the surveillance planning device 100 may be displayed on the screen 210 of the user terminal 200. The surveillance planning device 100 may provide a menu on the screen 210 of the user terminal 200 to select whether the camera installation plan is before or after the purchase of the camera. The user may select a 'before purchase of camera' menu in the case of a camera installation plan before purchasing a camera, and may select an 'after purchase of camera' menu in the case of a camera installation plan after purchasing a camera. A scenario and checklist items of the interface may be determined according to whether the camera installation plan is before or after the purchase of a camera.

Figure 9:
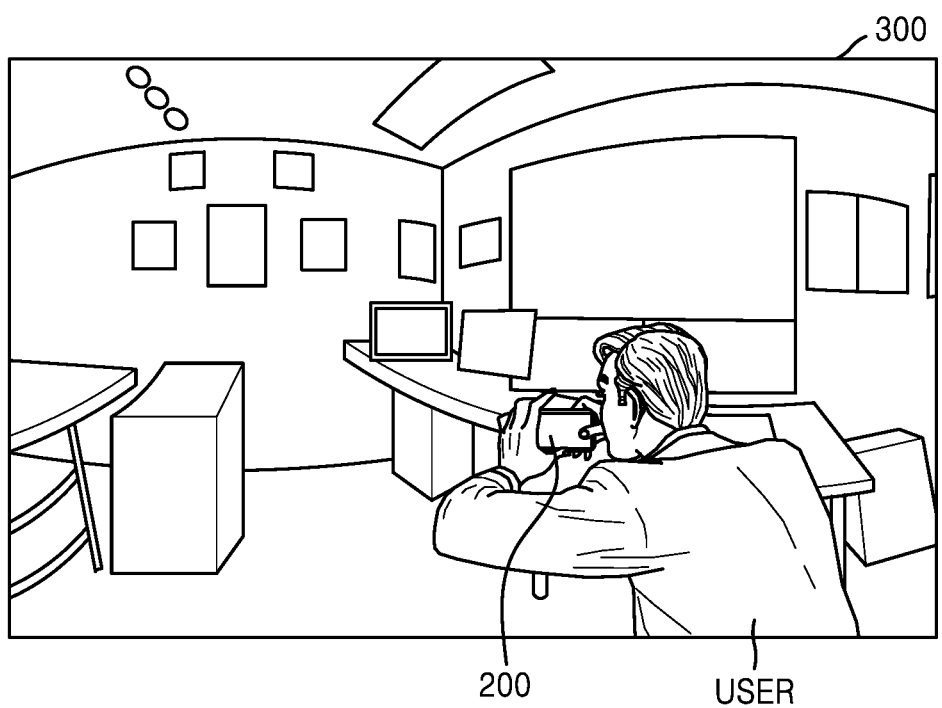
Figure 10:
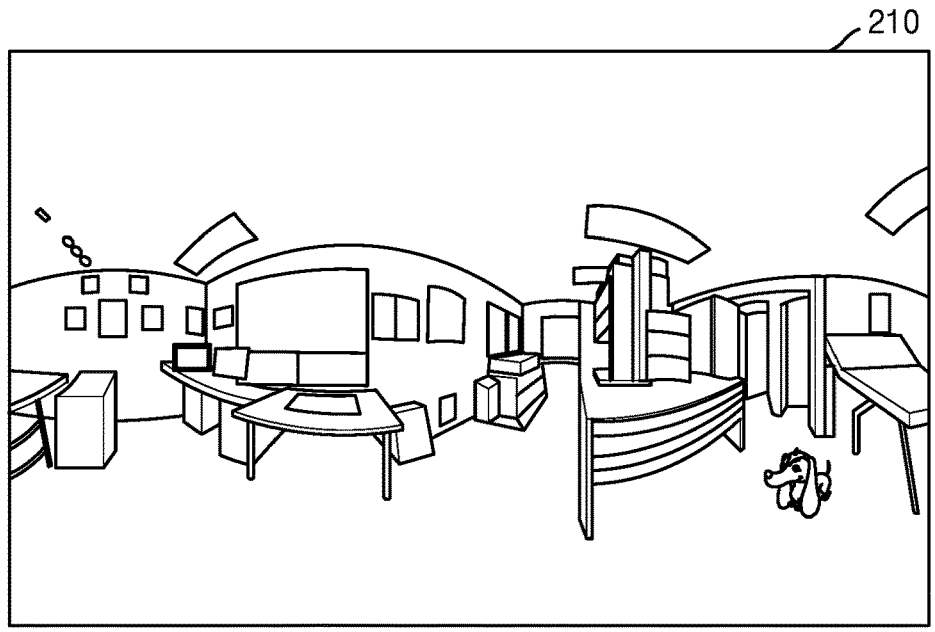
Figure 11:
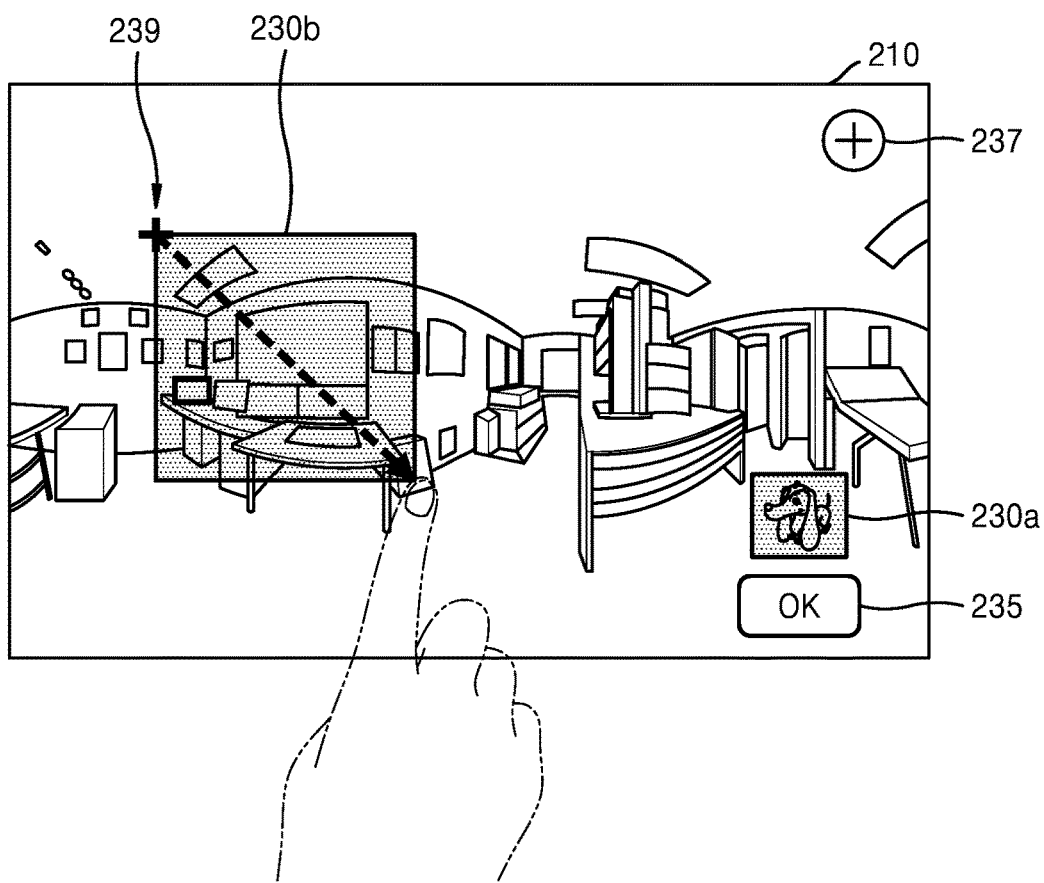

FIGS. 9 through 11 are diagrams illustrating an example of obtaining spatial information and object information through a user terminal according to an embodiment of the present disclosure.

Referring to FIG. 9, a user USER may scan a region 300 of a site where a camera is to be installed, by using the user terminal 200.

Referring to FIG. 10, an image of a region, obtained by scanning using the user terminal 200 (region image), may be displayed on the screen 210 of the user terminal 200. Also, the region image may be transmitted to the surveillance planning device 100. The surveillance planning device 100 may obtain spatial information and/or object information by analyzing the region image.

Referring to FIG. 11, the user USER may select at least one sub-region from the region image displayed on the screen 210. The user USER may designate the entire region image or a portion of the region image to select a sub-region. The user USER may select a sub-region by including a static object or a dynamic object.

The user USER may select a region designation menu 237 overlapping the region image displayed on the screen 210. When a region designation mark 239 is displayed on the region image as a response to selecting of the region designation menu 237, the user USER may designate a sub-region by dragging the region designation mark 239. The user USER may add a sub-region by selecting the region designation menu 237 again. The user USER may select an OK menu 235 when designation of a sub-region is completed. FIG. 11 illustrates an example in which a first sub-region 230*a* for designating a dynamic object and a second sub-region 230*b* for designating a certain space are selected in a region image.

Figure 12:

FIG. 12 illustrates an example of providing a checklist to a user terminal according to an embodiment of the present disclosure.

Referring to FIG. 12, the surveillance planning device 100 may generate a checklist to obtain information on a device required to monitor a sub-region and device installation condition required for calculating an installation location, based on spatial information and/or object information of a region. The surveillance planning device 100 may provide the generated checklist to the screen 210 of the user terminal 200. FIG. 12 illustrates an example of a checklist including a field where a camera is to be installed (home, retail store, commerce, office, etc.), an installation location (indoors, outdoors), a grade of a camera (classified from entry to premium according to the price and specifications), a surveillance time (daytime, nighttime). A plurality of items of the checklist may be displayed on the screen 210 by a right scroll bar. The user USER may select an 'OK' menu when drawing up of the checklist is completed. The user USER may also omit drawing up of a checklist by selecting a 'skip' menu.

Figure 13:

FIG. 13 illustrates an example of providing a camera list to a user terminal according to an embodiment of the present disclosure.

Referring to FIG. 13, the surveillance planning device 100 may provide a list of cameras suitable for the selected region on the screen 210 of the user terminal 200. The camera list may be provided on the screen 210 separately from the region image or may be provided as an image overlapping the region image. FIG. 13 is an example of a camera list in which information on three cameras to be installed in a region is provided. The user USER may select at least one camera from the camera list.

Figure 14:
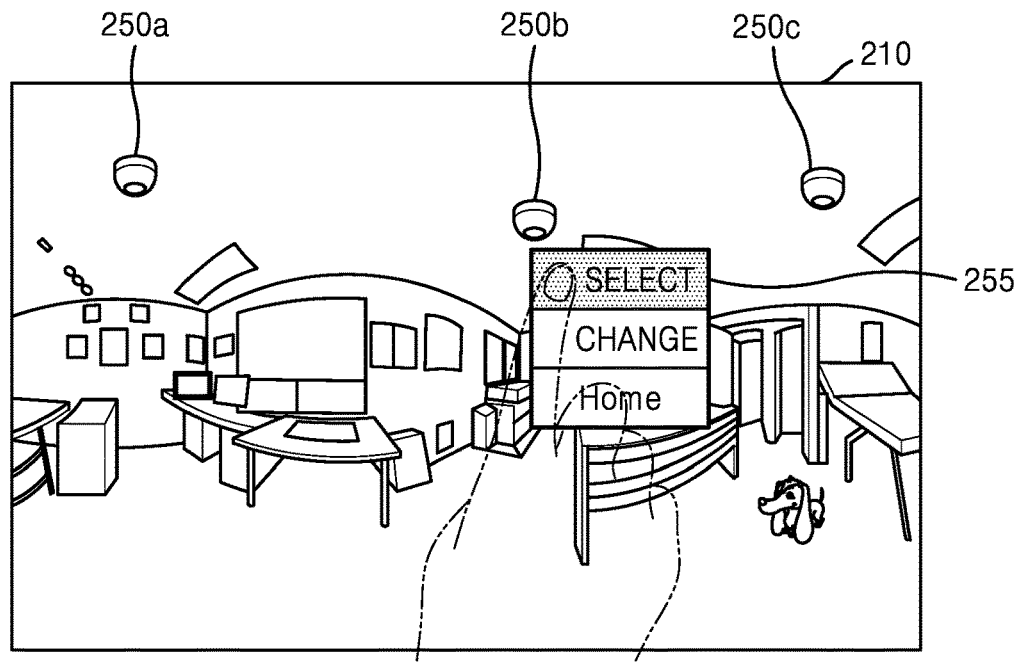

FIG. 14 illustrates an example of providing a camera installation location to a user terminal according to an embodiment of the present disclosure.

Referring to FIG. 14, the surveillance planning device 100 may calculate a location at which the camera selected from the camera list is to be installed, and overlap and display a virtual camera on an installation location of a region image provided, on the screen 210 of the user terminal 200. FIG. 14 illustrates an example in which installation locations of three virtual cameras 250a, 250b, and 250c are calculated and the three virtual cameras 250a, 250b, and 250c overlap and are displayed at the respective installation locations in a region image. The surveillance planning device 100 may provide a window 255 for selecting 'select camera/change camera/return to start (Home)' at each installation location by overlapping the window 255 on the region image. The user USER may select one of 'select camera/change camera/return to start (Home)' to select a camera assigned to at least one installation location among three candidate installation locations. The user USER may select the 'change camera' menu and select another camera from the camera list. The surveillance planning device 100 may match and store the selected or changed camera to correspond to the installation location according to a camera selection request or a camera change request. Although not illustrated, the user USER may change the installation location by dragging a virtual camera. The surveillance planning device 100 may store the changed installation location.

Figure 15:
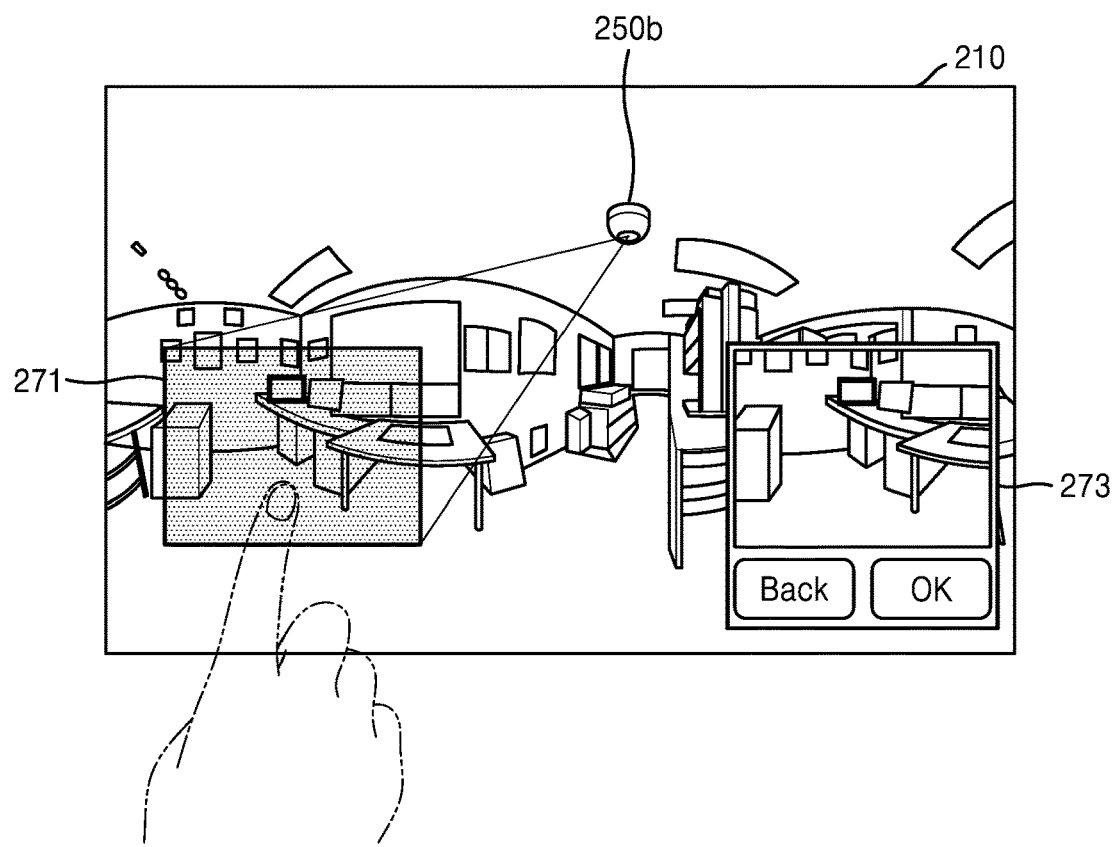
Figure 16:
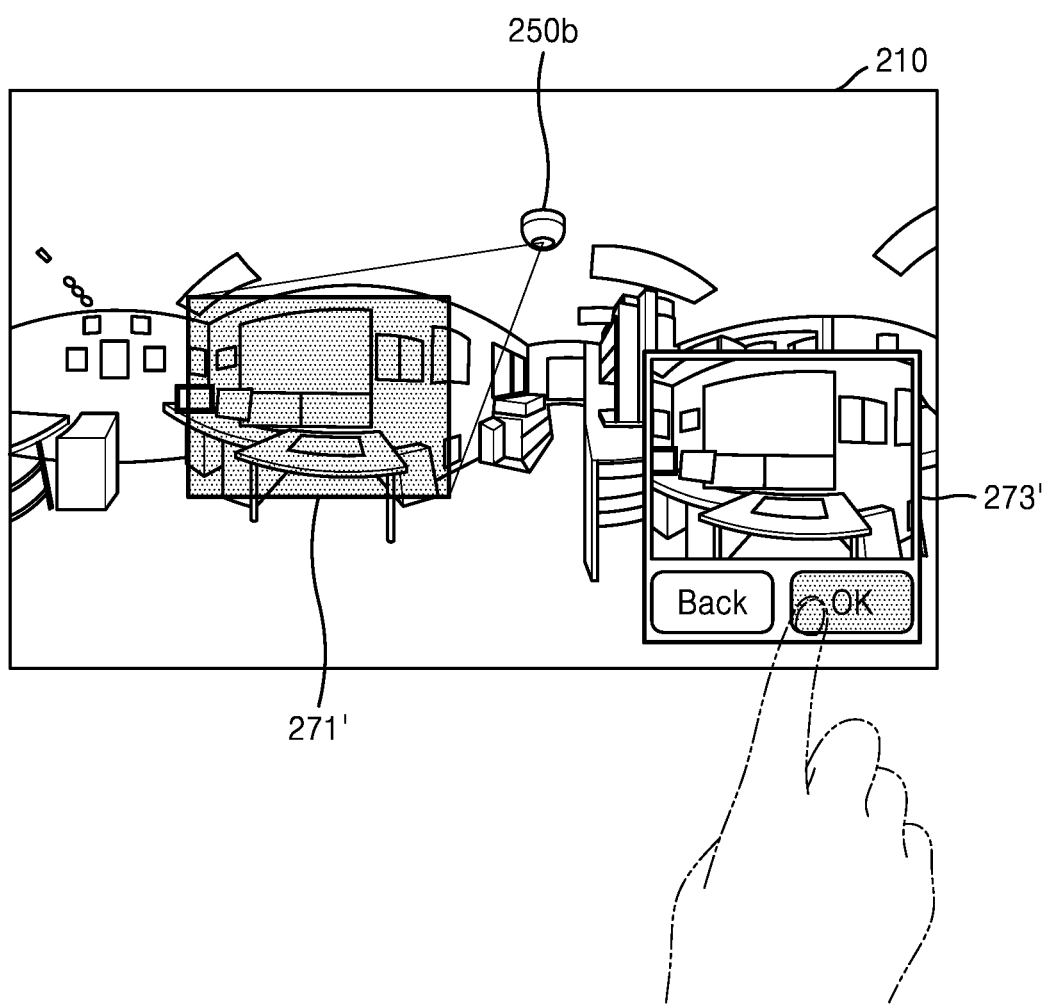

FIGS. 15 and 16 are diagrams illustrating an example of determining a camera installation location through a user terminal according to an embodiment of the present disclosure.

Referring to FIG. 15, when the user USER selects the 'select camera' menu to complete camera selection, the surveillance planning device 100 may overlap and display a surveillance range 271 of the selected camera and an operation simulation result 273 of the camera on the region image. The user USER may check the simulation result (273) and fine-tune the surveillance range 271 of the camera.

Referring to FIG. 16, the surveillance planning device 100 may change settings of the camera according to an adjusted surveillance range 271' to re-execute a simulation, and provide an updated simulation result 273' by overlapping the same on the region image. When it is necessary to change the camera and/or installation location according to adjustment of a surveillance range, the surveillance planning device 100 may recommend again a camera list and/or camera installation location on the screen 210 of the user terminal 200, as illustrated in FIGS. 13 and 14.

Figure 17A:
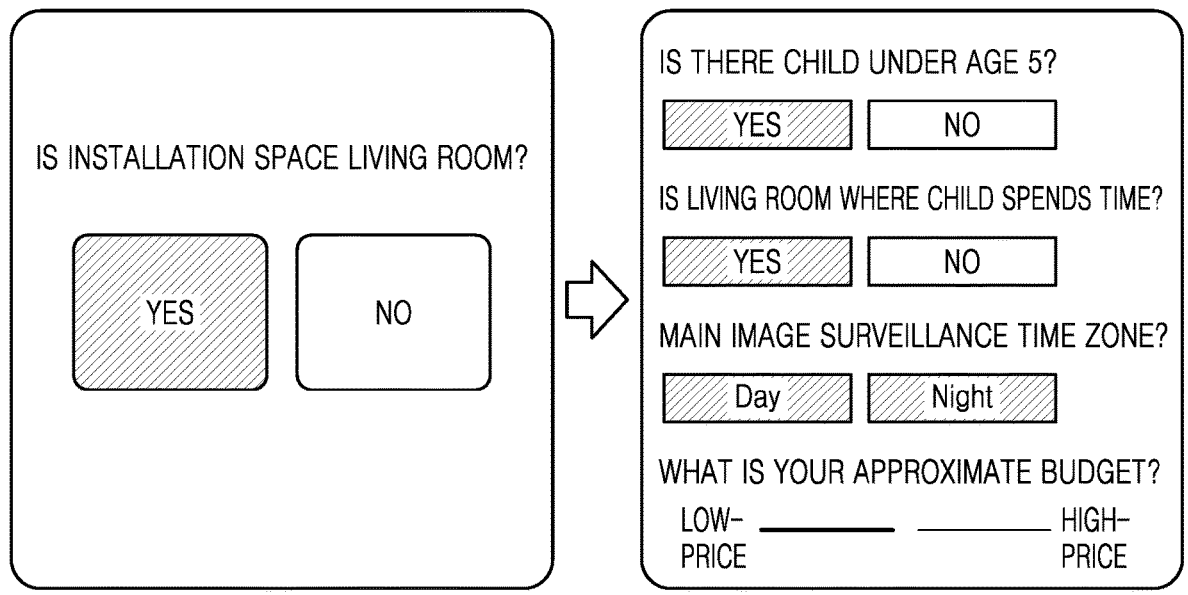
FIGS. 17A through 17C are diagrams illustrating examples of a checklist provided to a user terminal according to an embodiment of the present disclosure.
Figure 17B:
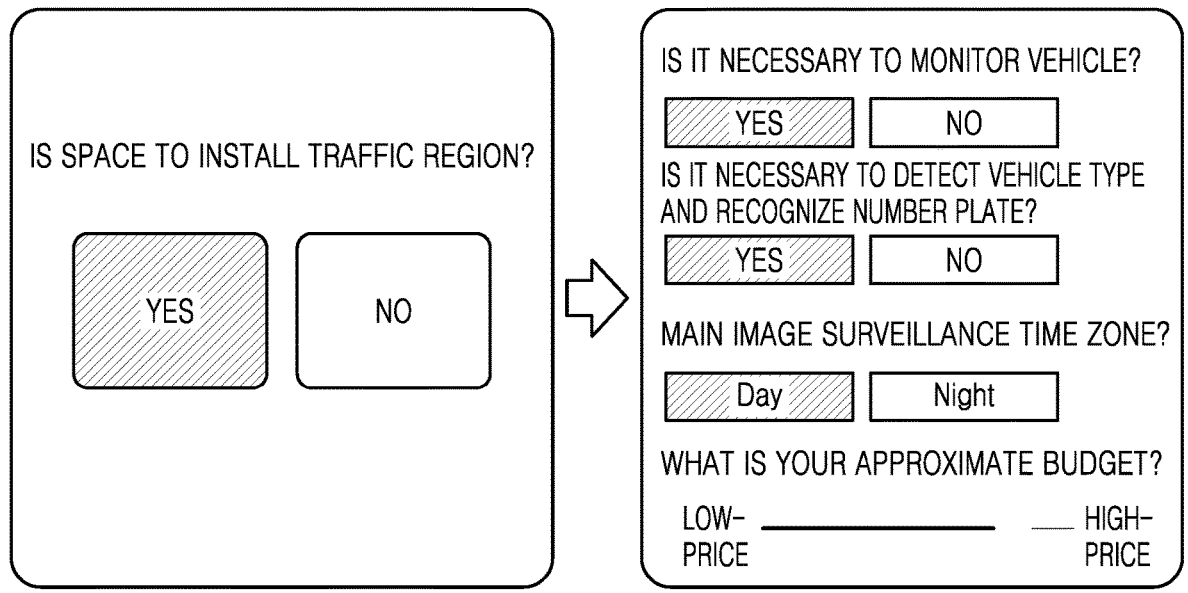
Figure 17C:
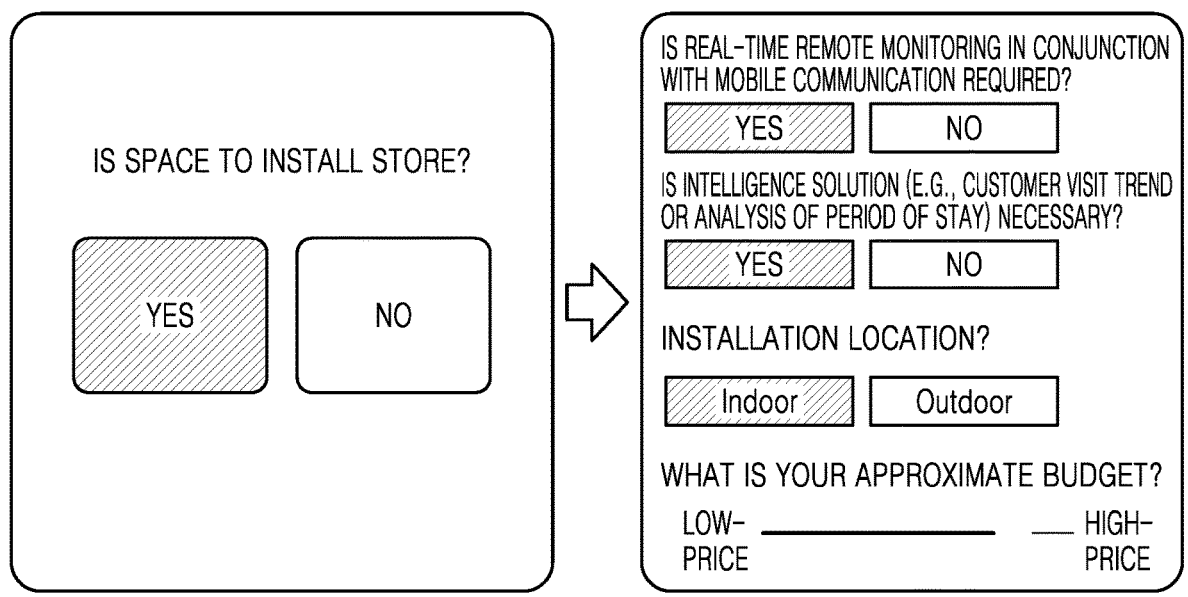

FIGS. 17A through 17C are diagrams illustrating examples of a checklist provided to a user terminal according to an embodiment of the present disclosure.

The surveillance planning device 100 may obtain spatial information and/or object information through analysis of an image input through scanning, and dynamically generate a checklist for each region and/or a checklist for each object based on the spatial information and/or object information.

When spatial information of an input image is obtained, the surveillance planning device 100 may request the user terminal 200 to reconfirm the spatial information, and when the user confirms the spatial information, the surveillance planning device 100 may generate a checklist suitable for the confirmed spatial information. The surveillance planning device 100 may generate a checklist by additionally considering object information detected from a region, that is, an input image obtained by capturing an image of the region. The request for reconfirmation and the checklist may be provided through an interface of an application displayed on the screen 210 of the user terminal 200.

FIG. 17A illustrates an example of a checklist including items necessary for monitoring a living room of a house when spatial information of an image is identified as the living room. For example, the surveillance planning device 100 may generate a primary checklist including an item for checking whether an installation space is the living room and provides the primary checklist to the user terminal 200. When the installation space is confirmed to be the living room, the surveillance planning device 100 may generate a secondary checklist including items that are suitable for surveillance of the living room, such as whether or not there is a child under the age of five, whether the child spends time in the living room, main surveillance time zones, and a budget, and provide the same to the user terminal 200.

FIG. 17B illustrates an example of a checklist including items necessary for monitoring a traffic region when spatial information of an image is identified as the traffic region. For example, the surveillance planning device 100 may generate a primary checklist including an item for checking whether an installation space is a traffic region, and provide the primary checklist to the user terminal 200. When the installation space is confirmed to be the traffic region, the surveillance planning device 100 may generate a secondary checklist including items that are suitable for surveillance of the traffic region, such as whether vehicles are monitored, whether a function of detecting vehicle information is activated, main surveillance time zones, and a budget, and provide the same to the user terminal 200.

FIG. 17C illustrates an example of a checklist including items necessary for monitoring a store when spatial information of an image is identified as the store. For example, the surveillance planning device 100 may generate a primary checklist including an item for checking whether an installation space is a store, and provide the primary checklist to the user terminal 200. When the installation space is confirmed to be the store, the surveillance planning device 100 may generate a secondary checklist including items that are suitable for surveillance of the store, such as whether real-time monitoring in conjunction with mobile communication is required, whether a function of detecting information for consumer pattern information is activated, an installation location in the store, and a budget, and provide the same to the user terminal 200.

As illustrated in FIGS. 17A through 17C, according to the embodiment of the present disclosure, some items of a checklist may be configured differently according to spatial information and/or object information of a region, and some common items of the checklist such as monitoring time zone setting (daytime or night time), budget setting, or the like may be included.

The user may change a setting menu of an application and select at least one of camera recommendation, installation location recommendation, and vendor recommendation of the application, and change each recommendation scenario of the application. Also, the user may change the setting menu of the application and designate a range of specification information of a recommended camera.

According to the surveillance planning device according to an embodiment of the present disclosure, the number of cameras and an optimal installation location for each monitoring region may be recommended by analyzing a scanned image based on a recommended camera, and the user may correct a camera location. The recommendation of a camera installation location may vary according to the number of cameras or the monitoring regions. A plurality of locations where a region selected by a user is focused most optimally may be on the ceiling. The user may select one of a plurality of candidate locations and check whether a desired monitoring result comes out, from a simulation result provided by an application. For example, when a camera is clicked, the surveillance planning device may provide an image preview function from a viewpoint of the camera to the application, and the user may check whether a desired monitoring result has come out via the application. When installing several cameras, the surveillance planning device may recommend not only a location that includes a monitoring region but also a location that includes a blind region.

According to an embodiment of the present disclosure, a method of scanning and analyzing an installation site and arbitrarily installing a camera in the actual site by using VR according to types of cameras or positions may be provided. Also, according to an embodiment of the present disclosure, a suitable camera is recommended to a user through an analyzed result, thereby providing a method for a purchaser to easily install a camera.

According to an embodiment of the present disclosure, even when a user is not a professional installation engineer, the user may simulate installation of a security device virtually and check a preview image before installing the security device and set a surveillance range in advance.

According to the surveillance planning device according to an embodiment of the present disclosure, information on installation locations of a security device such as a camera and camera settings may be guided to a user. After scanning a space as 3D data by using a mobile camera, the user may be provided with information on camera installation locations and camera types. After the user selects a type of camera, the surveillance planning device may provide the user with an image according to the height, angle, and focus of the camera, thereby providing the user with the convenience to check a preview of a recorded image before purchasing the camera. The surveillance planning device may guide a check on detailed specifications of a recommended camera and purchase of the camera in conjunction with a camera sales website.

The surveillance planning method according to the present disclosure may also be embodied as computer-readable code on a computer-readable recording medium. The computer-readable recording medium may include any type of recording device that stores data which can be read by a computer system. Examples of the computer-readable recording medium include ROM, RAM, CD-ROMs, magnetic tape, floppy disks, optical data storage devices, etc. The computer-readable recording medium can also be distributed over network-coupled computer systems so that the computer-readable code is stored and executed in a distributed fashion. Also, functional programs, code, and code segments for accomplishing the present disclosure can be easily construed by programmers skilled in the art to which the present disclosure pertains.

While the present disclosure has been described with reference to an embodiment illustrated in the accompanying drawings, this is merely exemplary, and it will be understood by those skilled in the art that various modifications and other equivalent embodiments may be made therefrom. Therefore, the scope of the present disclosure should be defined only by the appended claims.

What is claimed is:

1. A surveillance planning device comprising:
    a first collector configured to obtain spatial information and object information of a region, from a user terminal;
    a second collector configured to generate a checklist with respect to the region based on at least one of the spatial information and the object information and obtain device installation condition information based on a user response to the checklist, received from the user terminal;
    a recommender configured to provide, to the user terminal, a list of devices to be installed in the region based on the spatial information, the object information, and the device installation condition information and provide an installation location of a device selected from the list, to the user terminal; and
    a simulator configured to provide an operation simulation result of the device at the installation location to the user terminal.

2. A surveillance planning device of comprising:
    a first collector configured to obtain spatial information and object information of a region, from a user terminal;
    a second collector configured to generate a checklist with respect to the region based on at least one of the spatial information and the object information and obtain device installation condition information based on a user response to the checklist, received from the user terminal;
    a recommender configured to provide, to the user terminal, a list of devices to be installed in the region based on the spatial information, the object information, and the device installation condition information and provide an installation location of a device selected from the list, to the user terminal; and
    a simulator configured to provide an operation simulation result of the device at the installation location to the user terminal,
    wherein the first collector receives an image of each of a plurality of regions of a site where the device is to be installed, from the user terminal, and obtains spatial information and object information from the image.

3. The surveillance planning device of claim 2, wherein the second collector generates a checklist of each of the plurality of regions.

4. The surveillance planning device of claim 3, wherein the checklist includes a budget item.

5. The surveillance planning device of claim 2, wherein the second collector provides a list of objects detected from the image as one of a plurality of items of the checklist.

6. The surveillance planning device of claim 1, wherein the recommender receives a signal for changing the installation location from the user terminal and re-generates a list of cameras suitable for the changed installation location.

7. The surveillance planning device of claim 1, wherein the recommender recommends an installation location of a device for monitoring a plurality of sub-regions designated in an image of the region and an installation location of a device for monitoring a blind region other than the sub-regions.

8. The surveillance planning device of claim 1, wherein the simulator provides a surveillance range of the device to the user terminal, and changes a setting of the device when a signal for adjusting the surveillance range of the device is received from the user terminal.

9. The surveillance planning device of claim 8, wherein the recommender recommends a device to monitor the adjusted surveillance range and an installation location of the device again.

10. The surveillance planning device of claim 1, wherein the recommender provides specifications and purchase information of the device to the user terminal.

11. A method, performed by a surveillance planning device, of providing a security device installation solution, the method comprising:
   obtaining spatial information and object information of a region, from a user terminal;
   generating a checklist with respect to the region based on at least one of the spatial information and the object information;
   obtaining device installation condition information based on a user response to the checklist, received from the user terminal;
   providing, to the user terminal, a list of devices to be installed in the region based on the spatial information, the object information, and the device installation condition information;
   providing an installation location of a device selected from the list, to the user terminal; and
   providing an operation simulation result of the device at the installation location to the user terminal.

12. The method of claim 11, wherein the obtaining of the spatial information and object information comprises receiving an image of each of a plurality of regions of a site where the device is to be installed, from the user terminal, and obtaining spatial information and object information from the image.

13. The method of claim 12, wherein the generating of the checklist comprises generating a checklist of each of the plurality of regions.

14. The method of claim 13, wherein the checklist comprises a budget item.

15. The method of claim 12, wherein a list of objects detected from the image is provided as one of a plurality of items of the checklist.

16. The method of claim 11, further comprising receiving a signal for changing the installation location from the user terminal and re-generating a list of cameras suitable for the changed installation location.

17. The method of claim 11, wherein the providing of the installation location comprises recommending an installation location of a device for monitoring a plurality of sub-regions designated in an image of the region and an installation location of a device for monitoring a blind region other than the sub-regions.

18. The method of claim 11, further comprising providing a surveillance range of the device to the user terminal, and changing a setting of the device when a signal for adjusting the surveillance range of the device is received from the user terminal.

19. The method of claim 18, further comprising recommending a device to monitor the adjusted surveillance range and an installation location of the device again.

20. The method of claim 11, further comprising providing specifications and purchase information of the device to the user terminal.

* * * * *